(12) United States Patent
Eckhardt et al.

(10) Patent No.: US 7,078,887 B1
(45) Date of Patent: Jul. 18, 2006

(54) PLL LOOP FILTER CAPACITOR TEST CIRCUIT AND METHOD FOR ON CHIP TESTING OF ANALOG LEAKAGE OF A CIRCUIT

(75) Inventors: James P. Eckhardt, Pleasant Valley, NY (US); Paul D. Muench, Poughkeepsie, NY (US); George E. Smith, III, Wappingers Falls, NY (US); Alamgir A. Tamboli, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/040,138

(22) Filed: Jan. 21, 2005

(51) Int. Cl.
*G01R 23/12* (2006.01)

(52) U.S. Cl. ..................... 324/76.53; 324/763

(58) Field of Classification Search ............ 324/76.53, 324/763; 327/156; 331/44
See application file for complete search history.

(56) References Cited

U.S. PATENT DOCUMENTS 5,973,571 A * 10/1999 Suzuki ................... 331/17
6,832,173 B1 * 12/2004 Starr et al. .................. 702/106

* cited by examiner

*Primary Examiner*—Walter Benson
(74) *Attorney, Agent, or Firm*—Lynn L. Augspurger

(57) ABSTRACT

A test circuit within an existing design to enable the test circuit to test directly within the circuit. This invention provides a way to test and measure the leakage of the PLL loop filter capacitor leakage during test with a simple digital tester using existing pins. The test PLL circuit has circuit a plurality of capacitors and responsive amplifiers circuits for measuring leakage including a first capacitor set having multiple transistors coupled in series and with a reference resistor circuit coupled to a first amplifier and a second capacitor set having multiple transistors coupled in series and said reference resistor circuit coupled to a second amplifier to measure the leaking across the respective capacitors coupled to said first and second amplifiers and to provide an output of the leakage for measurement with the output of said first and second amplifiers. The reference resistor circuit is broken into several series resistors and additional transistors and resistors are supplied with their terminals shorted out, to allow for RIT-B circuit tuning. The output of the test circuit provides the measurement of analog leakage to a digital tester for testing of chips having the circuit during manufacturing test.

17 Claims, 2 Drawing Sheets

PLL LOOP FILTER CAPACITOR TEST CIRCUIT AND METHOD FOR ON CHIP TESTING OF ANALOG LEAKAGE OF A CIRCUIT

TRADEMARKS

IBM® is a registered trademark of International Business Machines Corporation, Armonk, N.Y., U.S.A. Other names used herein may be registered trademarks, trademarks or product names of International Business Machines Corporation or other companies.

BACKGROUND OF THE INVENTION

1. Field of the Invention

This invention relates to analog circuit tests, and particularly to circuits within a tested circuit for testing the tested analog circuit using a digital tester.

2. Description of Background

Before our invention external analog testers were used by IBM to test existing PLL designs which are sensitive to the characteristics of the loop filters. Most are sensitive to the leakage in the capacitors of that filter.

Prior solutions require using a dedicated analog test I/O, perhaps with an analog multiplexer to select which analog function is to be tested through a shared pin. As technology has progressed, it has become increasingly difficult to design such a solution. The additional leakage introduced by an analog multiplexer can disrupt the circuit activities. Adding a dedicated analog test I/O can introduce noise into the circuit. In addition, most manufacturing test instrumentation is not equipped to measure small analog values.

SUMMARY OF THE INVENTION

The shortcomings of the prior art are overcome and additional advantages are provided through the provision of a test circuit within an existing design to enable the test circuit to test directly within the circuit. The solution enables an analog test of a chip using a digital tester. This invention provides a way to test and measure the leakage of the PLL loop filter capacitor leakage during test with a simple digital tester using existing pins.

Our invention performs the analog test directly within the circuit, sending a digital signal to a standard digital test process. In this manner, tests can be performed during manufacturing test with only standard testing.

While this is described as a solution for PLL loop filter capacitor leakage measurements, it can be used to measure capacitor leakage generally.

Additional features and advantages are realized through the techniques of the present invention. The embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION OF THE INVENTION

Figure 1:
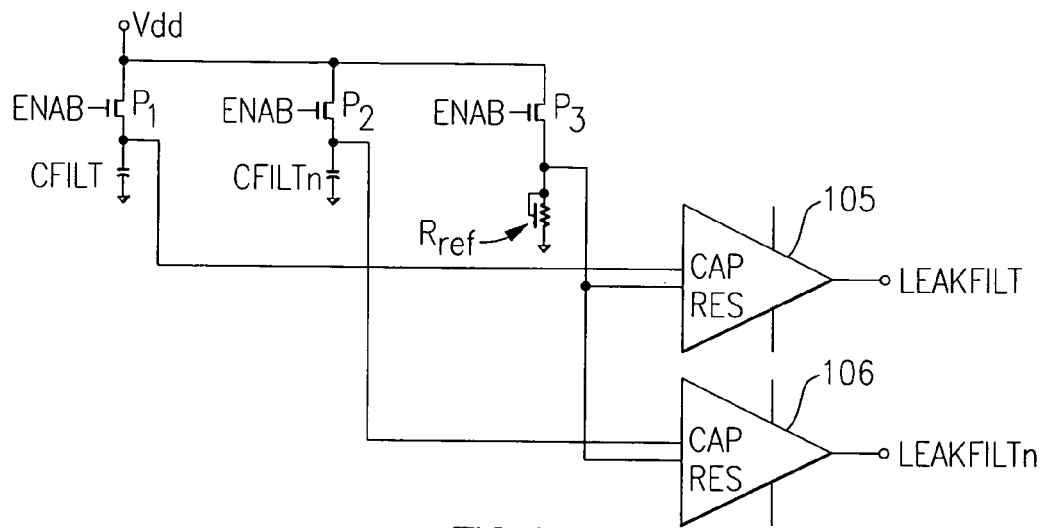
FIG. 1 illustrates one example of a simplified schematic diagram of the invention

As shown in FIG. 1, there are two capacitors to be tested. These capacitors are labeled Cfilt and Cfiltn and coupled to ground. Other connections to the capacitors are assumed and assumed to be disabled during testing and so are not shown.

To start a test, bring the enab_signal low. This causes the weak PFETs (three are shown as P1, P2, P3, with P1, P2 as examples of a plurality of possible PFETs, while P3 is provided with a coupling to reference resistor Rref) connected to their coupled capacitor to try to charge up the capacitor.

Thus if weak PFET P1 will charge Capacitor Cfilt and PFET P2 will charge Capacitor Cfiltn. If the capacitor is ideal, it will charge up to the supply voltage. The more leakage the capacitor has, the lower the voltage that will be generated. At the same time, PFET P3 will apply a voltage to the reference resistor R ref. This resistor models the equivalent leakage resistance that is acceptable. The transistor P3 driving the resistor Rref is 40× larger than the ones (P1, P2) driving the capacitors. This allows the reference resistor R ref to be 40× smaller in value. This is necessary as the acceptable leakage resistances are very large, in excess of 1 MegOhm. Without this multiplication, the reference resistor R ref would be impracticably large.

These voltages are compared using a differential amplifier circuit. The voltage from PFET P1 is compared to the voltage on reference resistor R ref by respective inputs to the differential amplifier 105, while the voltage from PFET P2 is compared to the voltage on reference resistor R ref by respective inputs to the differential amplifier 106. This output can then be used to drive standard digital output pins, leak-filt and leak-filtn respectively, for testing input to enable a way to test and measure the leakage of the PLL loop filter capacitor leakage during test with a simple digital tester using existing pins coupled to output pins leak-filt and leak-filtn.

Figure 2:
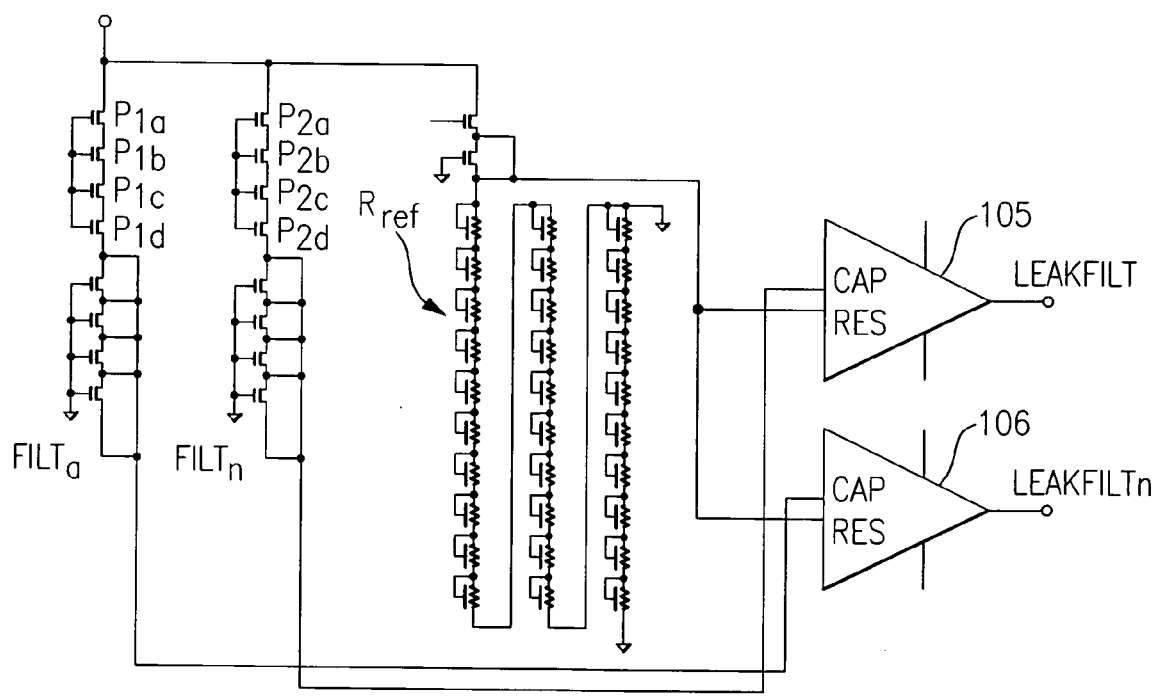
FIG. 2 illustrates one example of a detailed schematic of our implementation of the preferred embodiment having an added test circuit.

A detailed schematic of our implementation is shown in FIG. 2.

The capacitors are not shown in this schematic as this schematic is for the additions to the existing circuit. The plurality of capacitors, one for each transistor as shown in FIG. 1, are connected to the ports labeled filt and filtn on this schematic. Instead of a single transistor, multiple transistors are used and coupled in series as schematically illustrated in FIG. 2 in accordance with the preferred embodiment. The multiple transistors are illustrated as P1a, P1b, P1c and P1d for the first differential amplifier 105 set, while P2a, P2b, P2c and P2d are coupled to the second differential amplifier 106 of the differential amplifier circuit. This ensures that the manufacturing tolerances are small enough on these weak devices. Additional transistors are added, but are shorted out, to allow for an easy circuit tuning with a Release Interface Tape B Mask (RIT-B) circuit tuning tool.

A similar structure is used for the reference resistor R ref. The resistor R ref 104 is broken into several series resistors due to its size. Additional transistors and resistors are supplied, with their terminals shorted out, to allow for RIT-B circuit tuning.

Figure 3:
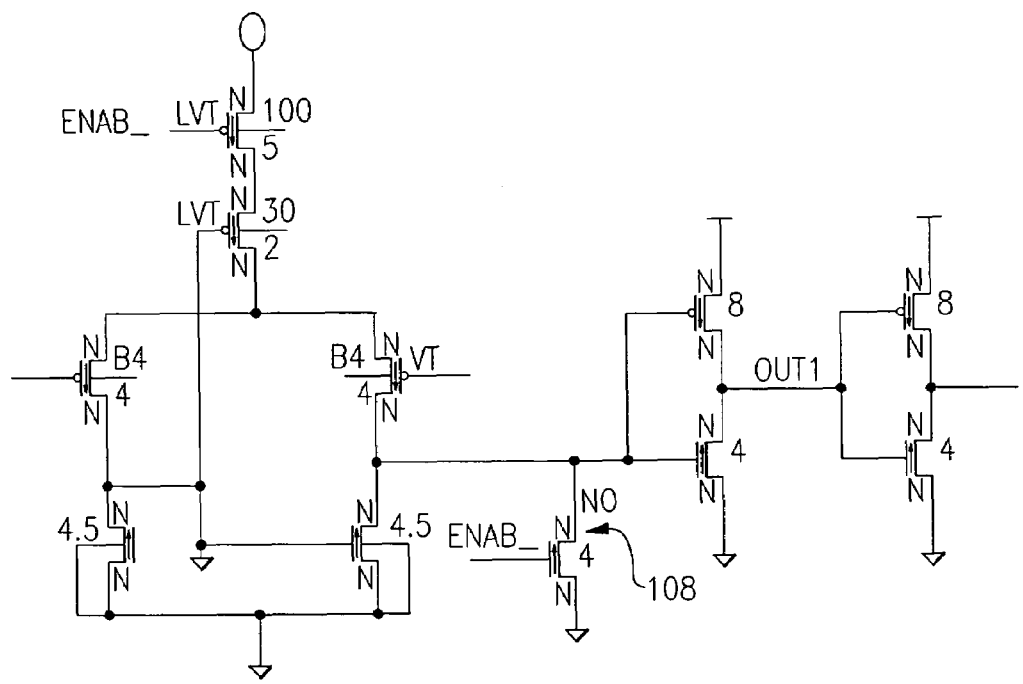
FIG. 3 illustrates one example of a schematic for the differential amplifier.
Figure 4:
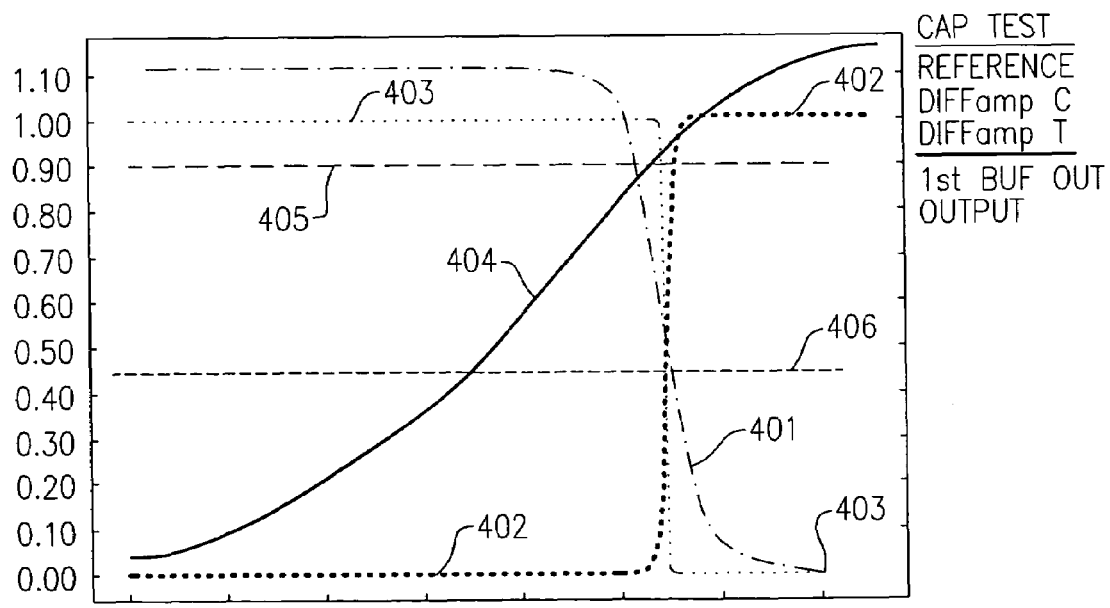
FIG. 4 illustrates results of a circuit simulation.

The schematic for each of the differential amplifiers 105, 106 is shown in FIG. 3. FIG. 3 represents a CMOS differential amplifier generally conventionally coupled; however, the top transistor is connected to the enable line enab_to allow it to be turned off as well. The transistor N0 108 ensures a suitable output is present, even when the amplifier is disabled. The amplifier in FIG. 3 has two inverters in series on the output. In FIG. 4, the dot dash dot line 401 (which could be yellow line with a colored drawing) is the input to the first inverter. The large dot line 402 (which is a colored drawing could be a red line) is the output from the first inverter and the input to the second. The small dotted line 403 (which in a colored drawing could be a tan line) is the output of the second inverter.

To test the structure of the invention, we simulated the circuit under varying conditions of assumed capacitor oxide thickness. It is well known that the leakage of a capacitor has an exponential dependence on the oxide thickness. The results of this simulation are shown in FIG. 4 below.

Here, in FIG. 4, the X axis represents oxide thickness in the capacitor, and the Y axis represents voltages at various points. The voltage on one of the capacitors is shown as a solid line 404 (which with a colored drawing could be green), the long dashed line 405 (which with a colored drawing could be purple) represents the reference voltage generated. The short dashed 406 (which with a colored drawing could be blue line) and dot dashed dot 401 (which with a colored drawing could beyellow) lines represent the voltage within the differential amplifier, while the large dotted line 402 (which with a colored drawing could be red) is the output of the first inverter, and the small dotted line 403 is the final output of the second inverter.

In the test case, the reference voltage is set to indicate acceptable leakage at 21 A of oxide. This is adjustable and could be adjusted by changing the reference resistor value.

While the preferred embodiment to the invention has been described above and particularly in the claims themselves, it will be understood that those skilled in the art, both now and in the future, may make various improvements and enhancements which fall within the scope of the claims which follow. These claims should be construed to maintain the proper protection for the invention first described.

What is claimed is:

1. A Phase Locked Loop Filter Capacitor Circuit, comprising:
   a Phased Locked Loop (PLL) circuit on a chip having a filter capacitor and within the PLL circuit a test PLL circuit is provided for measuring leakage of the PLL filter capacitor, said test circuit enabling via a pinout for said PLL circuit chip testing with said test PLL circuit to an external digital tester to provide the results of an analog circuit test for said chip, and wherein there are provided for said test PLL circuit a plurality of capacitors and responsive amplifiers circuits for measuring leakage including a first capacitor and reference resistor coupled to a first amplifier and a second capacitor and said reference resistor coupled to a second amplifier to measure the leaking across the respective capacitors coupled to said first and second amplifiers.

2. The Phase Locked Loop Filter Capacitor Circuit according to claim 1 wherein said pinout for said PLL circuit testing is pulled high for testing of test PLL circuit chip.

3. The Phase Locked Loop Filter Capacitor Circuit according to claim 2 wherein the leakage of said filter capacitor with the test PLL circuit is measured for testing the PLL circuit chip.

4. The Phase Locked Loop Filter Capacitor Circuit according to claim 3 wherein the output enables sending a digital signal from said PLL circuit sending a digital signal output of said test PLL circuit to a digital tester to enable analog testing of the chip to be performed during manufacturing test with said digital tester.

5. The Phase Locked Loop Filter Capacitor Circuit according to claim 3 wherein the testing of said PLL circuit chip measures small analog leakage on said chip.

6. The Phase Locked Loop Filter Capacitor Circuit according to claim 1 wherein there are provided for said test PLL circuit a plurality of capacitors and responsive amplifiers circuits for measuring leakage including a first capacitor set having multiple transistors coupled in series and with a reference resistor circuit coupled to a first amplifier and a second capacitor set having multiple transistors coupled in series and said reference resistor circuit coupled to a second amplifier to measure the leakage across the respective capacitors coupled to said first and second amplifiers and to provide an output of the leakage for measurement with the output of said first and second amplifiers.

7. The Phase Locked Loop Filter Capacitor Circuit according to claim 6 wherein said reference resistor circuit is broken into several series resistors and additional transistors and resistors are supplied with their terminals shorted out, to allow for RIT-B circuit tuning.

8. The Phase Locked Loop Filter Capacitor circuit according to claim 6 wherein each of said first and second differential amplifiers a CMOS differential amplifier with a first enable amplifier transistor connected to the enable line enab_ to allow it to be disabled as well as turned on and having a second enable transistor to ensure a suitable output is present for testing, even when the amplifier is disabled.

9. A method of testing a chin for analog leakage on said chin comprising the steps of: providing on said chip to be tested a test PLL circuit having a test capacitor and within the test PLL circuit measuring leakage of the capacitor, said test PLL circuit enabling via a pinout for said chip having said test PLL testing on chic, said test PLL circuit providing test output in digital form using an external digital tester to provide an analog circuit test for said chip, and wherein there are provided for said test PLL circuit a plurality of capacitors and responsive amplifiers circuits for measuring analog leakage in said test PLL circuit including a first capacitor and reference resistor coupled to a first amplifier and a second capacitor and said reference resistor coupled to a second amplifier to measure within said test PLL circuit the leakage across the respective capacitors coupled to said first and second amplifiers.

10. The method according to claim 9 wherein said pinout for said PLL circuit testing is pulled high for testing of test PLL circuit chip.

11. The method according to claim 10 wherein the leakage of said capacitor with the test PLL circuit is measured for testing the PLL circuit chip.

12. The method according to claim 11 wherein the leaking across the respective capacitors coupled to said first and second amplifiers is measured within said circuit and the output of said amplifiers is fed to a digital tester.

13. The method according to claim 12 wherein there are provided for said test PLL circuit a plurality of capacitors and responsive amplifiers circuits for measuring leakage including a first capacitor set having multiple transistors coupled in series and with a reference resistor circuit coupled to a first amplifier and a second capacitor set having multiple transistors coupled in series and said reference resistor circuit coupled to a second amplifier to measure the leaking across the respective capacitors coupled to said first and second amplifiers and to provide an output of the leakage for measurement with the output of said first and second amplifiers which is provided to said digital tester.

14. The method according to claim 13 wherein said reference resistor circuit is broken into several series resistors and additional transistors and resistors are supplied with their terminals shorted out for RIT-B circuit tuning.

15. The method according to claim 14 wherein each of said first and second differential amplifiers a CMOS differential amplifier with a first enable amplifier transistor connected to the enable line enab_ to allow it to be disabled as well as turned on and having a second enable transistor to ensure a suitable output is present for testing, even when the amplifier is disabled.

16. The method according to claim 15 wherein the output enables sending a digital signal from said PLL circuit sending a digital signal output of said test PLL circuit to a digital tester.

17. The method according to claim 16 wherein the testing of said PLL circuit chip measures small analog leakage on said chip.

* * * * *

UNITED STATES PATENT AND TRADEMARK OFFICE
CERTIFICATE OF CORRECTION

PATENT NO. : 7,078,887 B1
APPLICATION NO. : 11/040138
DATED : July 18, 2006
INVENTOR(S) : Eckhardt et al.

It is certified that error appears in the above-identified patent and that said Letters Patent is hereby corrected as shown below:

In the Claims:

Claim 9:

Col. 4, line 38, delete "chin" and insert --chip--
Col. 4, line 39, delete "chin" and insert --chip--
Col. 4, line 43, delete "chic" and insert --chip--

Signed and Sealed this

Second Day of January, 2007

JON W. DUDAS
*Director of the United States Patent and Trademark Office*